(12) United States Patent
Grube et al.

(10) Patent No.: US 8,383,958 B2
(45) Date of Patent: Feb. 26, 2013

(54) METHOD TO BUILD ROBUST MECHANICAL STRUCTURES ON SUBSTRATE SURFACES

(75) Inventors: Gary W. Grube, Pleasanton, CA (US); Gaetan L. Mathieu, Varennes (CA); Benjamin N. Eldridge, Danville, CA (US); Chadwick D. Sofield, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 299 days.

(21) Appl. No.: 12/783,967

(22) Filed: May 20, 2010

(65) Prior Publication Data

US 2010/0224303 A1 Sep. 9, 2010

Related U.S. Application Data

(62) Division of application No. 11/835,136, filed on Aug. 7, 2007, now Pat. No. 7,732,713, which is a division of application No. 10/831,870, filed on Apr. 26, 2004, now Pat. No. 7,251,884.

(51) Int. Cl.
*H01R 12/04* (2006.01)
*H05K 1/11* (2006.01)
*H05K 1/16* (2006.01)

(52) U.S. Cl. ........................ 174/267; 174/260
(58) Field of Classification Search .......... 174/260, 174/267
See application file for complete search history.

(56) References Cited

U.S. PATENT DOCUMENTS

| | | | |
|---|---|---|---|
| 2,648,785 A | 8/1953 | Tournier | |
| 3,231,664 A | 1/1966 | Acton | |
| 4,079,349 A | 3/1978 | Dorfeld | |
| 4,132,341 A | 1/1979 | Bratschun | |
| 4,406,059 A | 9/1983 | Scott et al. | |
| 4,712,723 A | 12/1987 | Moll et al. | |
| 4,866,108 A | 9/1989 | Vachon et al. | |
| 5,476,211 A | 12/1995 | Khandros | |
| 5,536,973 A | 7/1996 | Yamaji | |
| 5,994,152 A | 11/1999 | Khandros | |
| 6,188,028 B1 | 2/2001 | Haba et al. | |
| 6,255,126 B1 | 7/2001 | Mathieu | |
| 6,399,900 B1 | 6/2002 | Khoury et al. | |
| 6,672,876 B1 | 1/2004 | Takekoshi | |
| 6,694,612 B1 * | 2/2004 | Takenaka et al. | 29/846 |
| 6,803,701 B2 | 10/2004 | Kikuchi et al. | |
| 6,827,584 B2 * | 12/2004 | Mathieu et al. | 439/66 |
| 7,200,930 B2 | 4/2007 | Khandros et al. | |
| 7,251,884 B2 | 8/2007 | Grube et al. | |
| 7,732,713 B2 | 6/2010 | Grube et al. | |
| 2003/0018268 A1 | 1/2003 | Kikuchi et al. | |
| 2008/0020227 A1 | 1/2008 | Grube et al. | |

FOREIGN PATENT DOCUMENTS

| | | |
|---|---|---|
| JP | 2000-041299 | 2/2000 |
| JP | 2001-056345 | 2/2001 |
| JP | 2005-201659 | 7/2005 |
| JP | 2001-217543 | 8/2011 |
| TW | 445501 | 7/2001 |
| TW | 531645 | 6/2003 |

* cited by examiner

*Primary Examiner* — Jayprakash N Gandhi
*Assistant Examiner* — Dion Ferguson
(74) *Attorney, Agent, or Firm* — Kirton McConkie

(57) ABSTRACT

A robust mechanical structure is provided to prevent small foundation structures formed on a substrate from detaching from the substrate surface. The strengthened structure is formed by plating a foundation metal layer on a seed layer and then embedding the plated foundation structure in an adhesive polymer material, such as epoxy. Components, such as spring probes, can then be constructed on the plated foundation. The adhesive polymer material better assures the adhesion of the metal foundation structure to the substrate surface by counteracting forces applied to an element, such as a spring probe, attached to the plated foundation.

22 Claims, 7 Drawing Sheets

METHOD TO BUILD ROBUST MECHANICAL STRUCTURES ON SUBSTRATE SURFACES

CROSS-REFERENCE TO RELATED APPLICATION(S)

This application is a division of U.S. patent application Ser. No. 11/835,136, filed Aug. 7, 2007 (now U.S. Pat. No. 7,732, 713), which is a division of U.S. patent application Ser. No. 10/831,870, filed Apr. 26, 2004 (now U.S. Pat. No. 7,251, 884). The foregoing U.S. patent application Ser. Nos. 11/835, 136 and 10/831,870 are incorporated herein by reference in their entirety.

BACKGROUND

1. Technical Field

The present invention relates in general to fabrication of a mechanical structure on a substrate surface for robustly mounting Micro Electro Mechanical Systems (MEMS). More particularly, the present invention relates to a structure provided on a substrate surface for robustly mounting spring probes used on probe cards for testing integrated circuits on wafers.

2. Related Art

Mechanical structures are fabricated on substrate surfaces for a variety of applications. The substrate surfaces include polymers, metals, ceramics, semiconductors, etc. Typically to make electrical contact, a metal seed layer is deposited on the substrate surface to form bond pads for mounting the mechanical structures. As the size of the bond pad shrinks to accommodate smaller structures such as MEMS, or to accommodate limited spacing between small structures in an array, peeling or breaking of the metal seed layer from the substrate is more likely to occur, particularly with significant forces applied to mechanical structures formed on the bond pad. It, thus, becomes desirable to provide a robust support structure to prevent the metal seed layer from separating from the substrate.

One example of a MEMS structure mounted on a substrate surface includes a spring probe used to form a probe card for testing components on wafers, as illustrated in FIG. 1. A typical spring probe 2 is shown in FIG. 1 attached to a metal seed layer 4 provided on top of a layer 6 on a substrate 8. The layer 6 is optional, since the metal seed layer 4 can be directly connected to the substrate 8. The layer 6 is typically an insulator, but may be conducting, while the seed layer 4 is a metal, creating a metal-dielectric layer over the substrate 8. Metals making up the seed layer 4 can include copper, gold, silver, palladium, tungsten, titanium, aluminum, nickel, or a material that facilitates bonding of the spring probe 2, or further electroplating to form the spring probe 2. Alternatively, a bi-layer, multi-layer, or alloy of two or more of these materials, such as titanium-tungsten, copper-nickel-gold, etc. may provide the seed layer 4. Insulators making up layer 6 can include polyimide (PI), benzocyclobutene (BCB), FR4, ceramics, filled polymer or other materials. The substrate 8 is typically a multi-layer ceramic material, but may be a multi-layer organic, metal matrix, metal, semiconductor or other. The spring probe 2 is typically composed of thin gold wire 10 surrounded by a resilient material 12, such as nickel cobalt, with a thin layer of gold plating 14 applied to maximize electrical conductivity. The fabrication of the spring probes 2 on the layer 6 involves application of the metal seed layer 4 on the layer 6 and then subsequently bonding and patterning the wire 10, and plating the wire 10 to form layers 12 and 14. The complete probe 2 is about the diameter of a human hair.

Further details of spring probes used for wafer testing are described in U.S. Pat. No. 5,476,211 entitled "Method of Manufacturing Electrical Contacts Using A Sacrificial Member," and U.S. Pat. No. 5,994,152 entitled "Fabricating Interconnects and Tips Using Sacrificial Substrates," both incorporated herein by reference. Other types of spring probes similar to the spring probe of FIG. 2, such as those described in U.S. Pat. No. 6,255,126 entitled "Lithographic Contact Elements," incorporated by reference herein, can likewise be attached to metal seed layers provided on a substrate surface. Although spring probes are referenced, other mechanical structures can be mounted on substrates, and may benefit from features of the present invention described subsequently.

Increases in the density of integrated circuits (ICs) on a wafer require a similar decrease in spacing between spring probes in an array used on a probe card for testing the ICs. A decrease in the spacing between spring probes in an array means a decrease in the size of the bond pads formed in the metal seed layer. As the bond pads shrink, the absolute breaking or fracture strength of the seed layer to its underlying substrate material becomes critical.

FIG. 2 illustrates how a force F applied to the probe springs during testing of ICs on a wafer can cause the metal seed layer pads to detach from the polyimide surface. As shown, the force F applied to the spring probe 2 during testing can cause the metal seed layer pad 4 to detach from the substrate 6 in area 16.

The mechanical robustness of structures formed on a seed layer, such as spring probes, depends on: (1) the size of the contact area between the seed layer and the substrate surface, (2) surface preparation of the substrate, and (3) the degree of adhesion between the seed layer and the substrate surface on which it is formed. Minor changes in processing conditions such as hydration/dehydration conditions can cause deterioration of the adhesion strength between the seed layer and the substrate, leading to catastrophic failure of the seed layer connection to the substrate surface. In some cases, robust parts cannot be fabricated as the peel strength required for such robust structures exceeds the adhesion strength of the seed layer to the substrate on which it is formed.

It would be desirable to provide a robust mechanical structure to prevent small bond pads, or mechanical structures formed on a substrate surface from detaching from the substrate surface when forces are applied to structures on the substrate.

SUMMARY

In accordance with the present invention, a robust mechanical structure is provided to prevent mechanical structures formed on a substrate from detaching from the substrate surface.

The strengthened structure is formed by plating an additional metal layer on a metal seed layer to form a foundation, and then embedding the plated foundation structure in an adhesive material, such as epoxy or filled epoxy. Components, such as probe springs, can then be constructed on the deposited foundation, or transferred by soldering or mass joining to the foundation. The adhesive material forms a structure serving to improve mechanical robustness by counteracting forces applied to elements formed on or attached to the foundation to prevent the foundation from detaching from the substrate on which it is formed.

In one embodiment, the foundation is formed by the following steps:

(a) applying a masking material over the metal seed layer pads and substrate surface and patterning openings for a second metal plating layer over portions of the metal seed layer;

(b) applying the second metal plating layer in the openings and removing the masking material;

(c) providing a layer of adhesive material over the substrate surface, the metal seed layer pads and the second metal plating layer;

(d) planarizing the adhesive layer to expose the second metal plating layer; and (e) (optionally) plating the second metal layer with a third metal layer.

Spring probes or other small structures can then be formed or joined to the foundation or third metal layer. In an alternative embodiment, the third metal layer is not used. In a further alternative, the foundation is formed directly over the substrate without the metal seed layer.

In a further embodiment, the foundation includes a well for inserting a spring probe, or other mechanical structure that may then be affixed in the well by soldering or brazing or using an adhesive. The foundation is formed on a substrate with steps, similar to steps (a)-(e) of the first embodiment, but with an additional sacrificial metal well material formed in the foundation material, so that the sacrificial metal well material can later be etched or dissolved away leaving the foundation with a well.

In a further embodiment, the foundation posts of one or more of the embodiments described are formed separate from the substrate and then transferred and attached to the substrate by a procedure such as soldering, brazing, or by use of an adhesive. The reinforcing material is then applied around the foundation posts after attachment, and the reinforcing material and foundation posts are planarized. In a further embodiment, the substrate is etched away leaving the foundation posts embedded in the reinforcing material.

BRIEF DESCRIPTION OF THE DRAWINGS

Further details of the present invention are explained with the help of the attached drawings in which:

FIGS. 5D through 5D-1 illustrate an array of spring probes formed using the process illustrated in FIGS. 5A-5C;

DETAILED DESCRIPTION

Figure 1:
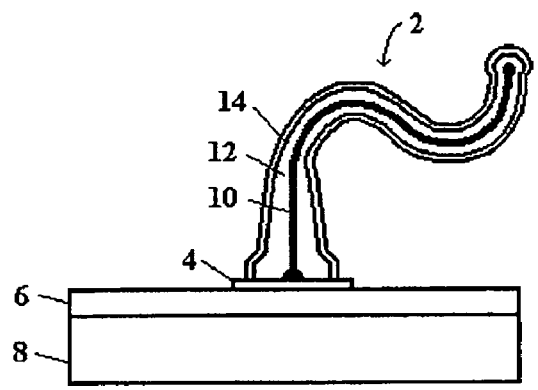
FIG. 1 shows a typical spring probe as formed on a metal seed layer pad provided on a substrate.
Figure 2:
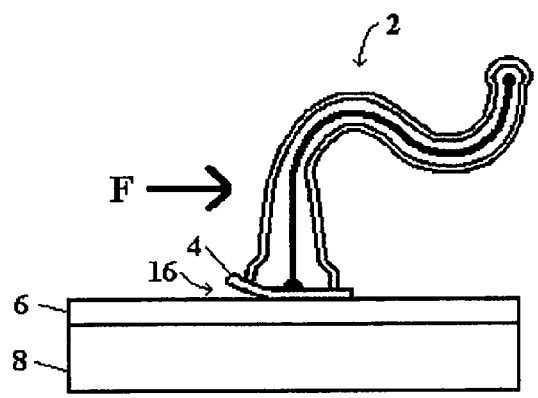
FIG. 2 illustrates a force applied to the spring probe of FIG. 1 causing detachment of the metal seed layer pad from the substrate.
Figure 3A:
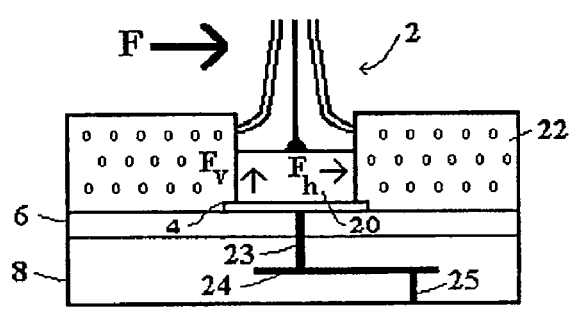
FIGS. 3A-3B illustrate a robust mechanical structure for supporting spring probes according to the present invention.

FIG. 3A illustrates a robust mechanical structure for supporting spring probes according to the present invention, including a foundation formed over a bond pad 4 for supporting a spring probe 2, a reinforcing insulation layer 22 provided around the foundation, and application of a force F to a spring probe 2 formed on the foundation. FIG. 3A includes a substrate 8 with a insulation coating layer 6 and a metal seed layer bond pad 4 formed on the layer 6, as described in FIGS. 1-2. In FIG. 3A, components carried over from FIGS. 1 and 2 are similarly labeled, as will be components carried over in subsequent drawings.

To provide the foundation, FIG. 3A includes a metal plating layer 20 applied over the metal seed layer 4. The spring probe 2 is shown constructed on the metal plating layer 20. A dielectric material 22 is provided over the exposed polymer surface 6, around the edges of the metal seed layer pad 4, around the edges of the metal plating layer 20, on a portion of the top of the metal pad 4, and around a portion of a spring probe structure 2. Examples of the dielectric material 22 include a polymer such as epoxy, acrylic adhesive, silicone or other. The dielectric material may also be a similar polymer filled with a reinforcing powder such as silicon carbide, silicon oxide, silicon nitride, tungsten carbide, aluminum oxide, aluminum nitride, titanium oxide, titanium nitride, or other appropriate filler material with a percent by volume of 0-99% relative to the polymer. A particularly preferred range is 30%-60% by volume. The preferred volume fraction will vary with the nature of the size distribution of the particles. The particle size should be chosen so that particles will tend to fill the spaces between adjacent structures. In some cases, conducting powders of metal or carbon may be desirable. In general, fillers for polymers used as reinforcing agents as known in the art would all be candidate materials. The metal seed layer 4 is formed over a via or conductive line 23 that interconnects through routing line 24 to a line 25 emerging on the opposite side of substrate 8. An electrical routing path is thus provided through the lines 23-25 and through metal seed layer 4, and metal plating layer 20 to a structure 2 formed on top. The substrate 8 is illustrated as a "space transformer" for routing signals from a pad in one location on a first surface of substrate 8 to a contact in a different location on an opposing surface. Alternative substrate arrangements may, however, be used, for example with line 23 being a via provided vertically directly through the substrate 8 to the opposing side.

As illustrated in FIG. 3A, a force F applied to the probe spring 2, or other structure that can be attached, is translated to a horizontal force Fh, and a vertical force Fv on the foundation structure within the non-adhesive dielectric material 22. The adhesion of the metal pad 4 to the substrate 6 is strengthened with the structure of FIG. 3A relative to the structure of FIGS. 1-2. However, the vertical force Fv will still potentially cause the foundation structure to slide along the vertical walls of the dielectric material 22 causing the metal seed layer pad 4 to separate from the layer 6.

Figure 3B:
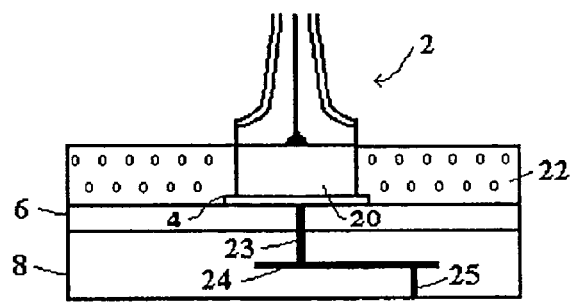

FIG. 3B illustrates an alternative with the reinforcing layer 22 not covering the base of spring probe 2. Reinforcing layer material 22 provided level with the foundation layer 20 may simplify attachment of structures, such as spring probe 2. In contrast, casting a structure on the foundation 20 may be simplified with reinforcement layer 22 forming a cavity, as in FIG. 3A.

To further strengthen the structure shown in FIGS. 3A-3B, in an alternative embodiment of the present invention, the reinforcing layer material 22 used is an adhesive material instead of a non-adhesive dielectric. Examples of the adhesive material include an epoxy resin, filled epoxy, cyanate ester, BCB or other materials with adhesive properties recognized in the art. Using an adhesive like epoxy, when a force Fv is applied as shown in FIG. 3A, the walls of the adhesive material 22 will adhere to prevent the foundation from sliding vertically relative to the adhesive material 22 and prevent the metal pad 4 from detaching from the layer 6.

Figure 4A:
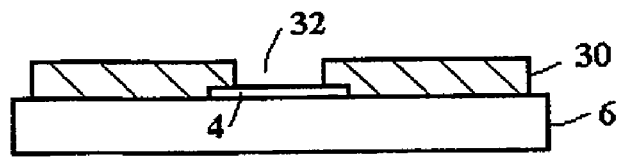
FIGS. 4A-4F illustrate the steps of one embodiment of a method for manufacturing a robust mechanical structure on a substrate surface.
Figure 4B:
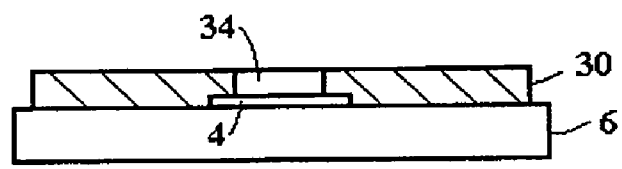
Figure 4C:
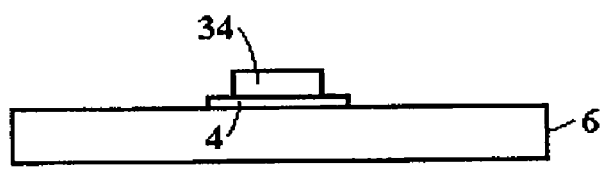

FIGS. 4A-4F illustrate the steps of one embodiment of a method according to the present invention for manufacturing a robust mechanical structure on a substrate surface. Initially, as shown in FIG. 4A, a masking material layer 30, such as photoresist, is applied over a metal seed layer 4 and a surface 6. The metal seed layer 4 and surface 6 can be composed of materials as previously described. The masking layer 30 is patterned using photolithography and etched leaving an opening 32 over a portion of the metal seed layer 4. A portion of the metal seed layer pad 4 remains covered by the masking material. In FIG. 4B, a second metal layer 34 then is deposited onto the metal seed layer 4 in the opening 32 of the masking layer 30. Methods for depositing the second metal layer 34 include electro-plating, electroless plating, physical vapor deposition (PVD), chemical vapor deposition (CVD) or other processes known in the art. Next, in FIG. 4C, the masking material 30 is removed leaving the second metal layer 34 on a portion of the metal seed layer 4.

Figure 4D:
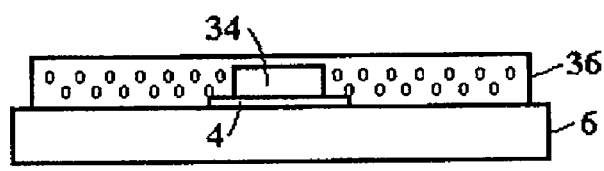
Figure 4E:
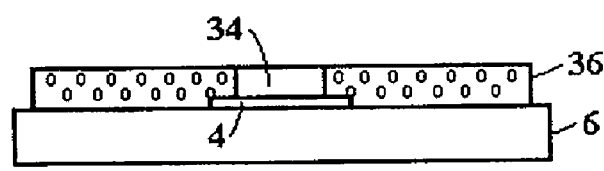
Figure 4F:
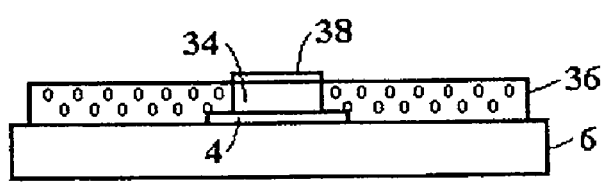

In FIG. 4D, an adhesive material 36, such as an epoxy or filled epoxy or other material described previously, is applied over the surface 6, seed layer 4 and second metal layer 34. In FIG. 4E, the adhesive layer 36 is planarized by lapping, grinding, polishing, or chemical mechanical polishing (CMP) to expose the second metal layer 34. In FIG. 4F, a third metal layer 38 is applied over the second metal layer 34 to provide a good electrically conductive bond surface. In one embodiment the second metal layer 34 is formed from nickel and its alloys, gold, silver, nickel-cobalt, nickel-palladium, nickel-tungsten, tungsten, palladium platinum, etc. The third metal layer 38 is a conductive material suitable for deposition or bonding, or joining by soldering or brazing, the conductive material for example being gold, aluminum, silver, copper, etc.

Figure 5A:
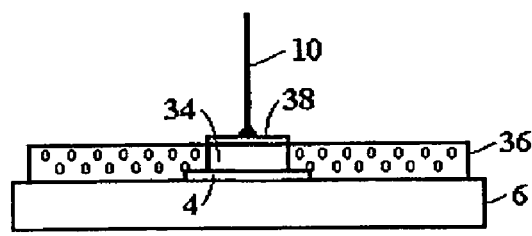
FIGS. 5A-5C illustrate steps for forming a spring probe on the structure formed by the steps of FIGS. 4A-4F.
Figure 5B:
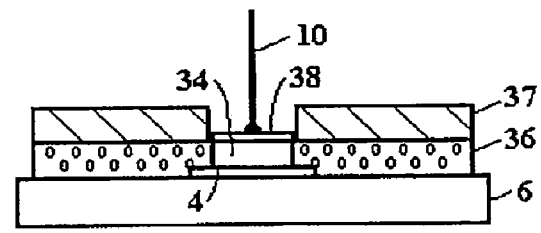
Figure 5C:
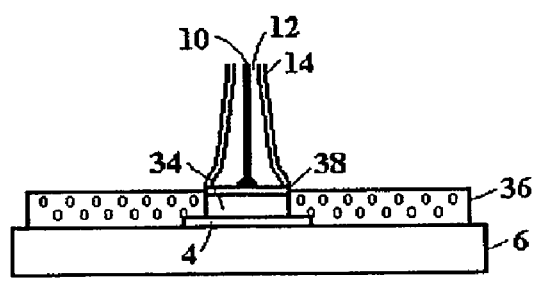

FIGS. 5A-5C illustrate steps for forming a spring probe on the structure formed by the steps of FIGS. 4A-4F. In FIG. 5A, fabrication of the spring probe begins by patterning (not shown) and bonding the wire 10 to the third metal layer 38. FIG. 5B shows a subsequent optional step where photoresist 37 is applied before bonding to allow the formation of layers around wire 10. In FIG. 5C fabrication continues with the wire 10 electroplated with a resilient material 12, such as nickel cobalt, and a conductive layer 14, preferably gold, being applied over the resilient layer 12. Further details of forming the spring probes are described in U.S. Pat. Nos. 5,476,211 and 5,994,152, referenced previously. Other spring probe structures, such as disclosed in U.S. Pat. No. 6,255,126, referenced previously, as well as other MEMS structures can likewise be formed or bonded to the structure shown in FIG. 4F. Other forms of probes, or other types of mechanical structures benefiting from the foundation providing an increased resistance to peeling can likewise be formed or joined to the foundation as design requirements might dictate.

Figure 5D:
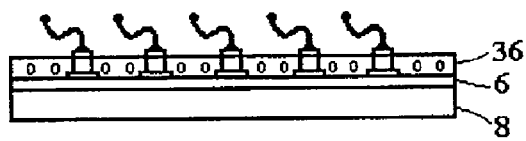
Figures 1, 5D:
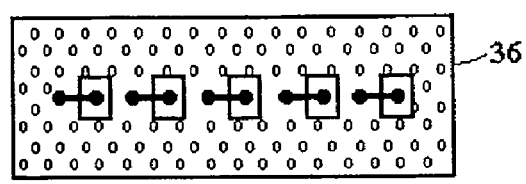

FIG. 5D shows a group of robust mechanical structures including plated foundations in an adhesive material 36 formed according to the process of FIGS. 4A-4F, with spring probes formed on the foundations, as illustrated in FIGS. 5A-5C. The steps of FIGS. 4A-4F can be performed so that multiple electroplated foundations of the array are formed together. FIG. 5D-1 shows a top view of the array of spring probes formed on foundations as shown in cross section in FIG. 5D. As shown in FIG. 5D-1, the foundation posts from a top view are rectangular in shape.

Figure 6A:
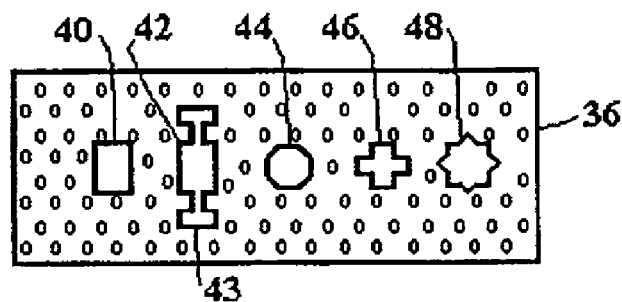
FIGS. 6A-6C illustrate different forms of the foundation structures as well as interconnecting traces.

FIG. 6A illustrates alternative shaped foundations to the rectangular shape shown in FIG. 5D-1 that can be used for wire bonding, or otherwise anchoring components. The rectangular shape 40 of FIG. 5D-1 is initially shown for reference in FIG. 6A. As a first alternative, a first shape 42 is illustrated including the rectangular post portion with attached anchors 43. The anchor portions 43 serve, in addition to the adhesive material 36 now encasing the foundation, to prevent the foundation 42 from peeling off of its underlying substrate. Another potential foundation shape is the round shape 44. Shapes similar to the circular shape 44 may be used with teeth or anchoring extensions to prevent rotation of the foundation on its underlying substrate. Such shapes include the cross shape with involutes 46, and the saw tooth shape 48. Other shape foundation posts can be used depending on the shape of the object to be mounted on the foundation, and the type of loads potentially applied to the mounted object.

Figure 6B:
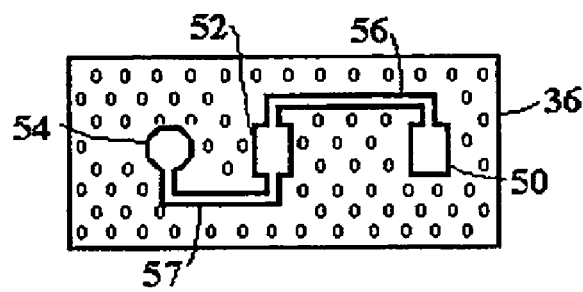

FIG. 6B is a top view illustrating two rectangular foundation posts 50 and 52 encased in an adhesive material 36 over a substrate, illustrating potential interconnection of the foundation posts 50 and 52 to a bond pad. The configuration of FIG. 6B, however, is one of many potential interconnection schemes. Interconnection in FIG. 6B is shown provided by traces 56 and 57. Trace 56 connects foundation posts 50 and 52, while trace 57 connects foundation post 52 to a bond pad 54. The traces 56 and 57 and bond pad 54 can be formed by plating a layer of metal over the adhesive material 36 and posts 50 and 52 and then patterning and etching away the metal layer to form traces 56 and 57 and bond pad 54. Traces 56 and 57 may be fabricated as controlled impedance transmission lines. The traces 56 and 57 may also be formed at the same time as the foundations, as "thick" traces that have the same height as the foundation features. Electrical traces may also be formed on top of the adhesive material 36, as part of a set of steps after FIG. 4E. This may be done by a sequence of: 1. blanket metallizing as by sputtering or metal seeding of the surface of layer 36, 2. applying photoresist and patterning to create the traces, and 3. plating the trace features, and stripping the resist and etching the blanket metal seed.

Figure 6C:
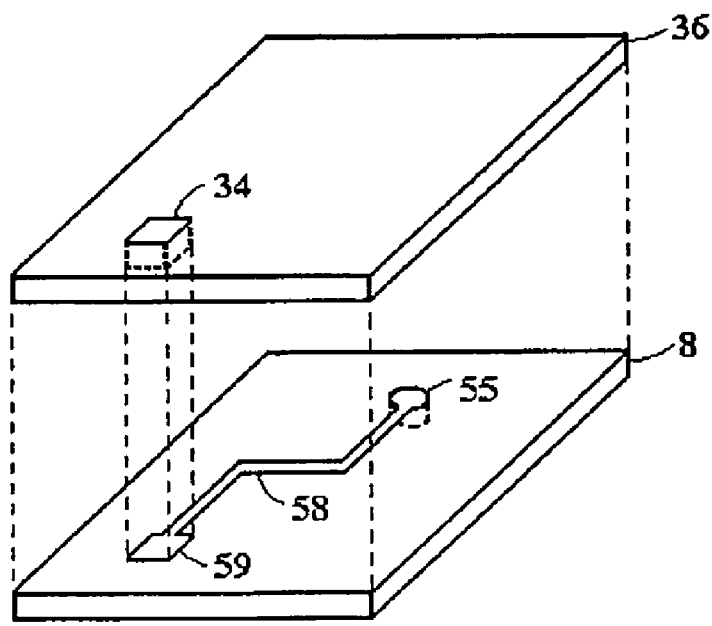

FIG. 6C shows an exploded perspective view illustrating that the foundation 34 can be provided over a patterned trace. The trace 58 is formed on substrate 8 as the starting surface for fabricating the foundation 34. The trace 58 is formed from a conductive material, such as a layered copper-nickel-gold, or other suitable conductive material that can be formed on the substrate 8 and provide a seed layer for forming the foundation 34. The substrate 8 can be a multilayer ceramic or multiplayer organic material, as described for FIG. 1, and can include an insulating top layer, such as layer 6 in FIG. 1. The trace 58 shown interconnects pads 55 and 59. Pad 55 is connected by a via to an opposing side of substrate 8 for connecting to a further trace, or other structure not shown. The pad 59 provides a seed layer for forming foundation 34. The foundation is encased in adhesive material 36, and can have a structure, such as the spring probe attached to its surface.

Figure 7A:
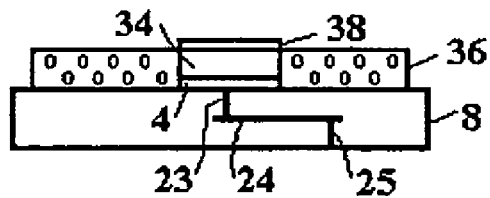
FIGS. 7A-7E illustrate alternative configurations for a robust mechanical structure.
Figure 7B:
Figure 7C:
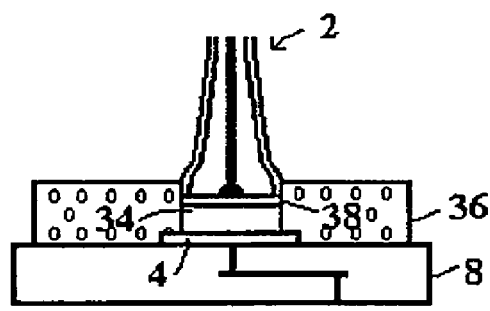
Figure 7D:
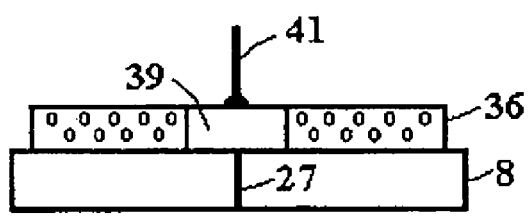
Figure 7E:
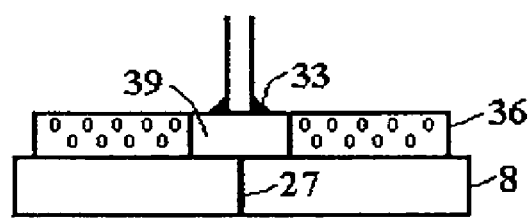

FIGS. 7A-7E illustrate alternative configurations for a robust mechanical structure for supporting elements on a metal seed layer over a substrate surface. FIG. 7A illustrates that a metal plating layer 34 provided over the metal seed layer 4 can be approximately the same size as the metal seed layer 4. Providing a foundation plating layer 34 as shown in FIG. 4F enables the adhesive material 36 to be applied over the top as well as the sides of seed layer 4 to better prevent detachment of the seed layer 4 from the substrate surface 6, but the adhesive material 36 will still provide support with the configuration of FIG. 7A. All of FIGS. 7A-7E illustrate that routing can be provided through lines 23-25 formed in the underlying substrate 8. Although a layer 6 over the substrate 8, as in FIG. 1, is not shown, it may optionally be included, as discussed previously. FIG. 7B illustrates that the adhesive material 36 can be applied without using additional plating on the metal seed layer 4 to form a foundation over the seed layer 4. Without plating 34 over the metal seed layer 4, less area will be available for the adhesive material 36 to adhere and counteract forces applied to structures formed over the metal seed layer 4, but some counteracting forces are still applied to the sides of the metal seed layer 4 by the adhesive material 36 in the structure of FIG. 7B to prevent detachment. FIG. 7C illustrates that the adhesive material 36 may be applied to cover part of a spring probe 2, or other attached element, along with being applied over the foundation layers, similar to the configuration of FIG. 3A. Use of centrification to apply layer 36 to the foundation may aid casting of the attached structure, such as a spring probe 2, as shown in FIG. 7C. FIG. 7D shows that a post or foundation 39 can be formed without a seed layer 4 or layer 38, illustrating these layers are optional. FIG. 7D further illustrates that a wire 41, or mechanical structure other than a spring probe can be attached to the foundation. FIG. 7D further illustrates that a via 27 can extend from the foundation 39 vertically without rerouting to the opposite side of the substrate 8. FIG. 7E illustrates that an element can be attached to the foundation 39 using a solder joint 33, or similar joint formed by brazing.

FIGS. 8A-8I illustrate the steps of another embodiment of a method according to the present invention for manufacturing a robust mechanical structure on a substrate surface. The structure formed as shown in the method of FIGS. 8A-8I forms a foundation over a seed layer, the foundation being encased in an adhesive, similar to the structure formed with the method of FIGS. 4A-4E. The structure made according to FIGS. 8A-8I is modified from FIGS. 4A-4E so that the foundation forms a well for attaching a mechanical structure, such as a spring probe.

Figure 8A:
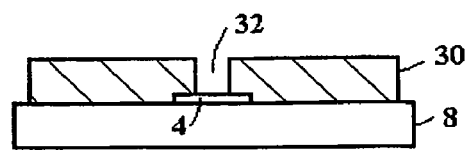
FIGS. 8A-8I illustrate the steps of another embodiment of a method for manufacturing a robust mechanical structure on a substrate surface, the robust mechanical structure including a well for inserting and attaching a mechanical structure.

The steps of the method begin with FIG. 8A, where a layer of masking material layer 30 is applied over a metal seed layer 4 and a substrate surface 8. Although not shown, the coating layer 6 may optionally be included on the substrate 8 as described previously. The masking layer 30 is patterned using photolithography and etched leaving an opening 32 over a portion of the metal seed layer 4. A portion of the metal seed layer pad 4 remains covered by the masking material 30. In all cases and embodiments shown, the spatial relation between the masking layer 30, and the metal seed layer 4 may be such that the masking 30 covers all, some or none of the bottom metal seed layer 4. If portions of the patterned seed layer feature 4 are covered by the masking layer 30, the feature 4 will be coated with later deposited metal, such as foundation region 34 described previously, where it is exposed. The materials used for the masking material 30, metal seed layer 4 and surface 8 can be any of those described with respect to FIGS. 4A-4E, or previously described embodiments.

Figure 8B:
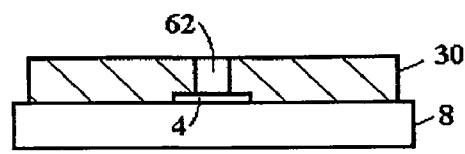
Figure 8C:
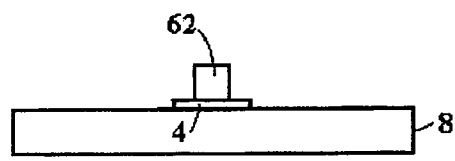
Figure 8D:
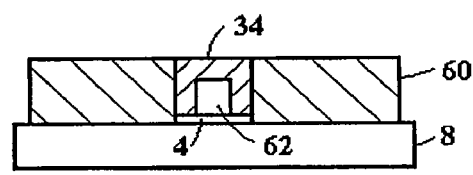
Figure 8E:
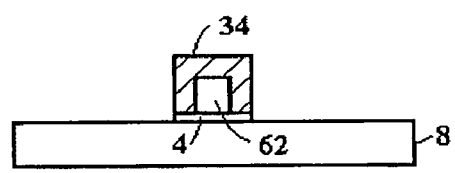

In FIG. 8B, a sacrificial metal layer 62 then is deposited onto the metal seed layer 4 in the opening 32 of the masking layer 30. Planarizing may then be optionally performed to level the surface of the sacrificial metal layer 62 with the masking layer 30 and to adjust the height of the sacrificial metal layer 62. Next, in FIG. 8C, the masking material 30 is removed leaving the sacrificial metal layer 62 on a portion of the metal seed layer 4. In FIG. 8D, an additional layer of masking material 60 is deposited and patterned using photolithography to form an opening around the sacrificial metal layer 62 and over the seed layer 4 in which a second metal layer 34 is deposited. The sacrificial metal layer 62 is a material that can be etched away or otherwise removed, while leaving the metal plating layer 34 intact. In one embodiment, the sacrificial metal layer 62 can be a copper material, while the material plating layer 34 is formed from nickel, a nickel alloy, or other similar material. In FIG. 8E, the masking material 60 is removed.

Figure 8F:
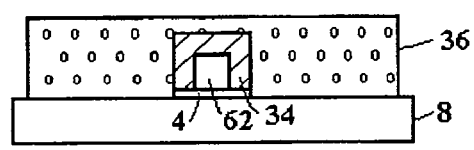
Figure 8G:
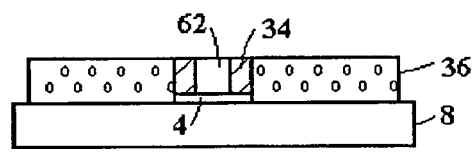
Figure 8H:
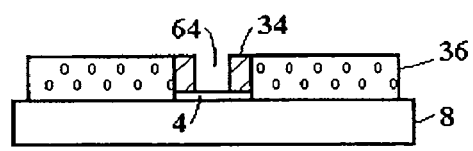

In FIG. 8F, an adhesive material 36, such as an epoxy or filled epoxy, is applied over the substrate surface 6, and around the foundation formed by the metal plating layer 34, and around the seed layer 4. In FIG. 8G, the adhesive layer 36 and foundation are planarized to expose the second metal layer 34. In FIG. 8H, the sacrificial metal layer 62 is then etched away, leaving a well 64 formed in the plating material 34. Although not shown, additional plating can further be applied over material 34 to facilitate later bonding or soldering. While this discussion uses a metal as the material for sacrificial layer feature 62, this sacrificial feature can also be created from an organic material, such as a photoresist or other polymer that is patterned to create this structure. This feature can then be dissolved through the use of appropriate solvents at the step shown in FIG. 8H.

Figure 8I:
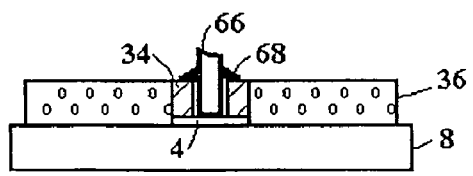

FIG. 8I illustrates how a MEMS or other structure 66 can be attached in the well 64. The structure 66 can be a spring probe, as described with respect to FIGS. 5A-5C, or another structure suitable for placing in the well 64. The structure 66 can be attached in the well 64 by methods such as brazing, or the soldering 68 shown, or by using conductive adhesive.

Figure 9A:
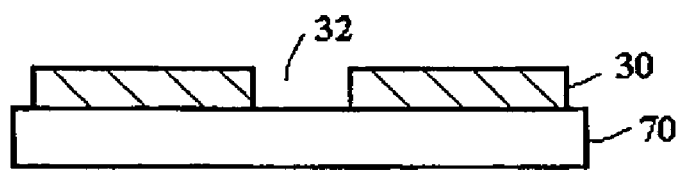
FIGS. 9A-9E illustrate an alternative method for forming a robust mechanical structure, by first forming robust foundation posts separate from a support substrate and then transferring the posts to a support substrate.
Figure 9B:
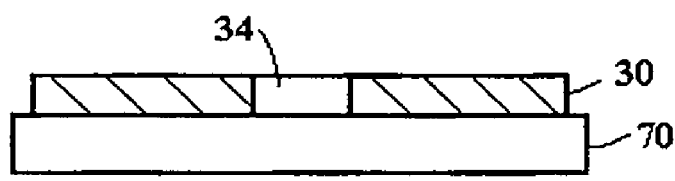
Figure 9C:
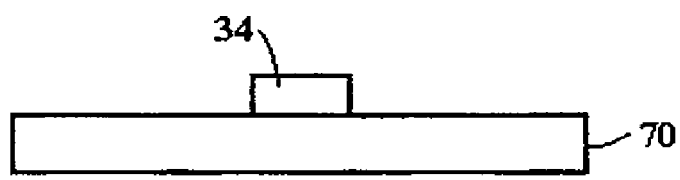

FIGS. 9A-9E illustrate an alternative method for forming a robust mechanical structure, by first forming robust foundation posts separate from a support substrate and then transferring the posts to a support substrate. Similar to the steps of FIGS. 4A-4C, in FIGS. 9A-9C a foundation post is formed by depositing masking material 30, patterning the masking material using photolithography to form an opening 32, filling the opening 32 with the material to form the foundation post 34, and then removing the masking material 30. Although a solid post 34 is shown formed in FIGS. 9A-9C, a post with an opening similar to that formed in FIGS. 8A-8C could likewise be formed. Unlike previously described procedures, the substrate 70 used in FIGS. 9A-9C is a sacrificial substrate 70 that can later be separated from the posts 34 by a procedure such as dissolving or etching to remove the sacrificial substrate 70 leaving the foundation posts 34. The sacrificial substrate 70 can be composed of a material, such as aluminum, copper, ceramic, titanium-tungsten, and the like.

Figure 9D:
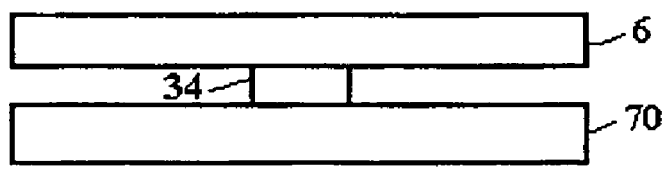
Figure 9E:
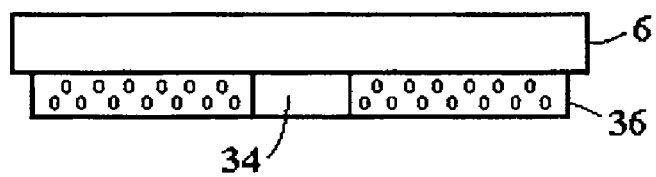

With the foundation posts formed, in FIG. 9D the support substrate 6 is attached to the foundation posts 34 by a procedure such as soldering, brazing, or by use of an adhesive. Although not shown, the support substrate can include seed layer pads, similar to the pads 4 of FIGS. 4A-4F to facilitate attachment of the foundation posts 34. After attachment of the foundation posts 34, the sacrificial substrate 70 is removed in FIG. 9D, leaving the foundation posts 34 attached to the support substrate 6, similar to the structure of FIG. 4E. The reinforcing material 36 is then applied around the foundation posts 34, and the reinforcing material 36 and foundation posts 34 are planarized, as illustrated in FIG. 9E.

Although the present invention has been described above with particularity, this was merely to teach one of ordinary skill in the art how to make and use the invention. Many additional modifications will also fall within the scope of the invention, as that scope is defined by the following claims.

What is claimed is:

1. A probe card comprising:
 a substrate;
 an electrical contact pad disposed on the substrate, the contact pad comprising an outer surface;
 a reinforcing layer disposed on the substrate and directly on a peripheral portion of the outer surface of the contact pad, the reinforcing layer comprising an opening through the reinforcing layer to an inner portion of the outer surface of the electrical contact pad;
 a conductive foundation disposed within the opening on the inner portion of the outer surface of the contact pad, wherein the conductive foundation is electrically coupled to the electrical contact pad, wherein the reinforcing layer surrounds and contacts sidewalls of the conductive foundation that extend substantially perpendicularly from the outer surface of the contact pad, the reinforcing layer thereby encasing the conductive foundation around the sidewalls; and
 a spring probe disposed on an outer surface of the conductive foundation, wherein the sidewalls of the conductive foundation are substantially perpendicular to the outer surface of the conductive foundation.

2. The probe card of claim 1, wherein the substrate is rigid.

3. The probe card of claim 1, wherein the foundation is adhered to the reinforcing layer, and the reinforcing layer is adhered to the substrate.

4. The probe card of claim 1, wherein the spring probe is partially encased in the reinforcing layer.

5. The probe card of claim 1, where in the spring probe is attached to the foundation by any of: a wire bond, plated metal, solder, brazing material, and conductive adhesive.

6. The probe card of claim 1, wherein the reinforcing layer covers the inner portion of the outer surface of the electrical contact pad.

7. The probe card of claim 1, wherein the reinforcing layer comprises a polymer.

8. The probe card of claim 7, wherein the reinforcing layer comprises a filled polymer.

9. The probe card of claim 1, wherein the reinforcing layer comprises a non-adhesive material.

10. The probe card of claim 1, wherein the reinforcing layer comprises an adhesive material.

11. The probe card of claim 1, wherein the conductive foundation has a shape selected from the group of shapes consisting of: round, rectangular, cross-shaped, and sawtooth shaped.

12. The probe card of claim 1, wherein the conductive foundation comprises anchor portions.

13. A probe card comprising:
 a substrate;
 an electrical contact pad disposed on a surface of the substrate, the contact pad comprising an outer surface that is substantially parallel to the surface of the substrate;
 a reinforcing layer disposed on the surface of the substrate and directly on a peripheral portion of the outer surface of the electrical contact pad, the reinforcing layer comprising an opening through the reinforcing layer to an inner portion of the outer surface of the electrical contact pad;
 a conductive foundation disposed within the opening on the inner portion of the outer surface of the contact pad, wherein the conductive foundation is electrically coupled to the electrical contact pad, wherein the reinforcing layer surrounds and contacts sidewalls of the conductive foundation that extend substantially perpendicularly from the outer surface of the contact pad, the reinforcing layer thereby encasing the conductive foundation around the sidewalls; and
 a spring probe disposed on an outer surface of the conductive foundation, wherein the sidewalls of the conductive foundation are substantially perpendicular to the outer surface of the conductive foundation.

14. The probe card of claim 13, wherein the spring probe is partially encased in the reinforcing layer.

15. The probe card of claim 13, wherein the reinforcing layer comprises a polymer.

16. The probe card of claim 15, wherein the reinforcing layer comprises a filled polymer.

17. The probe card of claim 13, wherein the reinforcing layer comprises a non-adhesive material.

18. The probe card of claim 13, wherein the conductive foundation has a shape selected from the group of shapes consisting of: round, rectangular, cross-shaped, and sawtooth shaped.

19. The probe card of claim 13, wherein the conductive foundation comprises anchor portions.

20. The probe card of claim 13, wherein the substrate is rigid.

21. The probe card of claim 1, wherein the conductive foundation is disposed on the inner portion of the outer surface of the conductive pad but is not disposed on the peripheral portion of the outer surface of the conductive pad.

22. The probe card of claim 21, wherein the peripheral portion of the outer surface of the conductive pad surrounds entirely the inner portion of the outer surface.

* * * * *